(12) United States Patent
Shrivastava

(10) Patent No.: US 6,258,714 B1
(45) Date of Patent: Jul. 10, 2001

(54) SELF-ALIGNED CONTACTS FOR SALICIDED MOS DEVICES

(75) Inventor: Ritu Shrivastava, Fremont, CA (US)

(73) Assignee: Alliance Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/283,727

(22) Filed: Apr. 1, 1999

(51) Int. Cl.[7] .................. H01L 21/8234; H01L 21/4763
(52) U.S. Cl. .................. 438/638; 438/197; 438/303; 438/586; 438/664; 438/740; 438/672; 438/685
(58) Field of Search .................. 438/197, 303, 438/585, 586, 664, 637, 638, 672, 740, 675, 685

(56) References Cited

U.S. PATENT DOCUMENTS

| | | | |
|---|---|---|---|
| 5,384,485 | * 1/1995 | Nishida et al. | 257/751 |
| 5,576,244 | * 11/1996 | Hayashi et al. | 438/301 |
| 5,672,535 | 9/1997 | Shrivastava et al. | 437/52 |
| 5,780,348 | * 7/1998 | Lin et al. | 438/303 |
| 5,877,081 | * 3/1999 | Matsumoto et al. | 438/624 |
| 5,885,895 | * 3/1999 | Liu et al. | 438/637 |
| 5,920,796 | * 7/1999 | Wang et al. | 438/700 |
| 5,990,524 | * 11/1999 | En et al. | 257/382 |
| 5,997,757 | * 12/1999 | Nagayama et al. | 438/740 |
| 6,015,741 | * 1/2000 | Lin et al. | 438/305 |
| 6,136,700 | * 10/2000 | McAnally et al. | 438/666 |

* cited by examiner

Primary Examiner—Carl Whitehead, Jr.
Assistant Examiner—Toniae M. Thomas
(74) Attorney, Agent, or Firm—Beyer Weaver & Thomas, LLP

(57) ABSTRACT

Provided is a method of forming self-aligned contacts in salicided MOS devices that provides improved reliability and decreased resistance relative to conventional tungsten polycide processing. Self-aligned contacts in salicided MOS devices are also provided. The method makes use of a metal, preferably titanium or cobalt, which is deposited on the devices' gates and diffusion regions and converted to a silicide with a resistance substantially less than that of tungsten silicide, preferably by RTA processing. A self-aligned contact etch stop mask is then formed over the gates and a portion of sidewall spacers on the gates. The presence of this "oversize" self-aligned contact etch stop mask prevents shorting of the subsequently deposited contact interconnect material to the gates, while allowing silicidation of the diffusion regions as well as the gates with a low resistance silicide, thereby improving device reliability and decreasing resistance.

15 Claims, 4 Drawing Sheets

SELF-ALIGNED CONTACTS FOR SALICIDED MOS DEVICES

BACKGROUND OF THE INVENTION

The present invention relates generally to semiconductor device fabrication. More specifically, the present invention relates to methods of making self-aligned contacts for salicided MOS devices.

Self-aligned contacts (SACs) are used in many semiconductor technologies such as DRAMs, SRAMs, and Flash memory. Conventionally, tungsten silicide (WSi$_x$) has been used as polycide (preformed and deposited silicide) and diffusions have not been silicided. In such cases, self-aligned contacts can be implemented using a polysilicon gate stack (e.g., poly 1/tungsten silicide (WSi$_x$)/silicon oxynitride (SiON)) because the SAC mask etch can selectively stop on SiON and diffusion materials while etching oxide.

A semiconductor device having a conventionally formed SAC is illustrated in FIG. 1. The device 100 is formed on a semiconductor substrate 102, typically composed of monocrystalline silicon. The device 100 is formed according to a series of fabrication steps well known to those of skill in the art. First, isolation regions (not shown) are formed on the substrate 102. Then a gate oxide layer 104 is formed on the surface of the substrate 102.

Next, a layer of polysilicon is formed on the gate oxide layer, typically by using a chemical vapor deposition (CVD) process well known to those with skill in the art. This polysilicon deposition step is followed by deposition of two additional layers of material, also typically using CVD. The first of these layers is composed of tungsten silicide (WSi$_x$), which collectively with the polysilicon layer is referred to as a "polycide" when the tungsten silicide deposited in this manner. The second layer is of a dielectric material that is resistant to a self-aligned contact etching procedure to be subsequently applied. Typical examples of this material include silicon oxynitride (SiON) or silicon nitride (Si$_3$N$_4$).

This three-layer stack is then patterned and etched to form distinct gates. The etch chemistry should have good selectivity to oxide so that the gate oxide material exposed by the etch on either side of the gates prevents penetration into the substrate. A typical etch may include two steps: a first step using chemistry to etch the top silicon oxynitride or silicon nitride layer. And the second step using chemistry to etch the silicide and polysilicon layers and stop at the gate oxide layer 104. In the example shown in FIG. 1, two gates are formed by the gate layer stack etch. Each gate is composed of a polysilicon layer 106, a tungsten silicide layer 108, and a SAC etch stop layer 110.

Once the gates have been formed, an LDD implant is performed to produce a shallow diffusion region 112 at the surface of the substrate 102 between and beside the gates. Then, sidewall spacers 114 are formed in a conventional manner by deposition of an oxide (TEOS), oxynitride, or nitride layer followed by an anisotropic etch. Deep implants 116 are then formed according to conventional procedures.

Following formation of the sidewall spacers 114 and diffusion regions 112/116, an interlayer dielectric 118 is formed. The second layer of dielectric 118, typically oxide (TEOS), is patterned and etched to form a contact hole. This etch step is referred to as a self-aligned contact etch because the SAC etch stop layer 110 and sidewall spacer 114 are not removed by the etch chemistry. The resulting physical contact area is self-aligned to the gate stacks, and does not require alignment of the contact to the gates. The SAC etch chemistry is selected to remove the oxide material of layers 118 and 104, while stopping on the silicon and silicon oxynitride or silicon nitride of the SAC etch stop layer 110, and minimally etching sidewall spacers 114.

Once the SAC etch has formed the contact hole, a layer of interconnect material 120 is deposited, patterned and etched to form a contact between the diffusion area 112/116 and a conductor above it (the conductor is not shown in FIG. 1).

This conventional process and structure has several drawbacks. First of all, the diffusion sheet resistance is relatively high since the diffusion is not silicided. Secondly, stress in tungsten silicide can be high, so that when gate oxide is scaled down below about 50 Å, reliability problems are experienced. In addition, tungsten silicide has a relatively high resistance for a silicide material, especially when line widths are scaled down.

In order to address these problems, titanium salicide (self-aligned titanium silicide) may be used. However, since substitution of a titanium salicide process into the conventional process would result in diffusions and polysilicon gates which are silicided after gate patterning and spacer processing, there would be no SAC etch stop layer present in the gate stack. Thus, the contact's interconnect material would short the gates to the diffusion following SAC processing.

Accordingly, what is needed is a method for self-aligned contact processing that provides improved reliability and decreased sheet resistance as semiconductor device sizes are decreased, and does not produce the drawbacks discussed above.

SUMMARY OF THE INVENTION

To achieve the foregoing, the present invention provides a method of forming self-aligned contacts in salicided MOS devices that provides improved reliability and decreased resistance relative to conventional tungsten silicide processing. Self-aligned contacts in salicided MOS devices are also provided. The method makes use of a metal, preferably titanium or cobalt, which is deposited on gates and diffusion regions and converted to a silicide with a resistance substantially less than that of tungsten silicide, preferably by rapid thermal annealing (RTA processing). An "oversize" self-aligned contact etch stop layer is deposited and a mask is then formed over the gates and a portion of sidewall spacers on the gates. The presence of this "oversize" self-aligned contact etch stop mask prevents shorting of the subsequently deposited contact interconnect material to the gates, while allowing silicidation of the diffusion regions as well as the gates with a low resistance silicide, thereby improving device reliability and decreasing resistance.

In one aspect, the present invention provides a method of making a self aligned contact in a MOS device. The method involves forming a polysilicon gate having sidewall spacers on a gate oxide on a semiconductor substrate having diffusion regions, and forming a metal silicide on the polysilicon gate and diffusion regions. A self-aligned contact etch stop mask is then formed over the silicided polysilicon gate and at least a portion of the sidewall spacers. An interlayer dielectric layer is formed over the masked gate and silicided diffusion regions, a self-aligned contact etch of the interlayer dielectric is conducted, and a conductive contact interconnect material is deposited in a contact hole created by the self-aligned contact etch. The invention also provides self-aligned contacts in salicided MOS devices.

These and other features and advantages of the present invention may be realized by reference to the remaining

BRIEF DESCRIPTION OF THE DRAWINGS

FIGS. 2E' and 2F' are cross-sectional views showing a self-aligned contact comprising a tungsten plug in a salicided MOS device after various fabrication steps in accordance with specific embodiments of the present invention.

DETAILED DESCRIPTION OF THE PREFERRED EMBODIMENTS

Reference will now be made in detail to a preferred embodiment of the invention. Examples of preferred embodiments are illustrated in the accompanying drawings. While the invention will be described in conjunction with these preferred embodiments, it will be understood that it is not intended to limit the invention to any particular preferred embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a method of forming self-aligned contacts in salicided MOS devices that provides improved reliability and decreased resistance relative to conventional tungsten silicide processing. Self-aligned contacts in salicided MOS devices are also provided. The method makes use of a metal, preferably titanium or cobalt, which is deposited on gates and diffusion regions and converted, preferably by RTA processing, to a silicide with a resistance substantially less than that of tungsten silicide. An "oversize" self-aligned contact etch stop mask is then formed over the gates and a portion of sidewall spacers on the gates. The presence of this "oversize" self-aligned contact etch stop mask prevents shorting of the subsequently deposited contact interconnect material to the gates, while allowing silicidation of the diffusion regions as well as the gates with a low resistance silicide, thereby improving device reliability and decreasing resistance.

Figure 1:
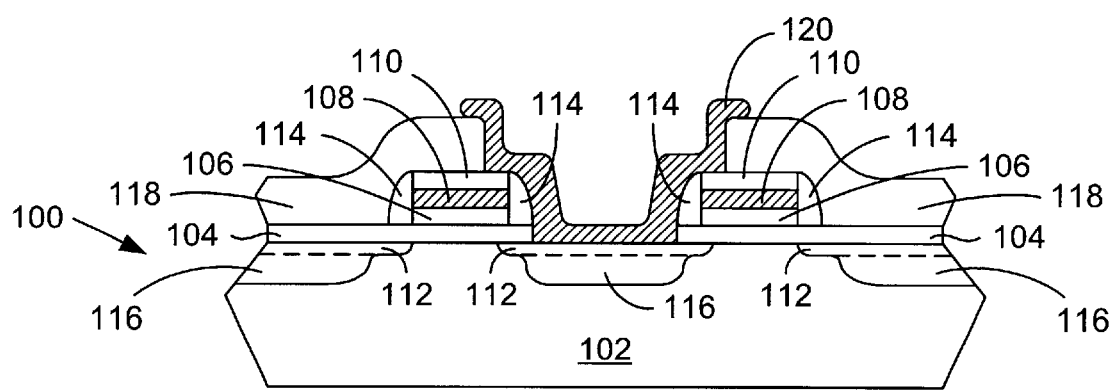
FIG. 1 is cross-sectional view of a conventional self-aligned contact in a silicided MOS device.
Figure 2A:
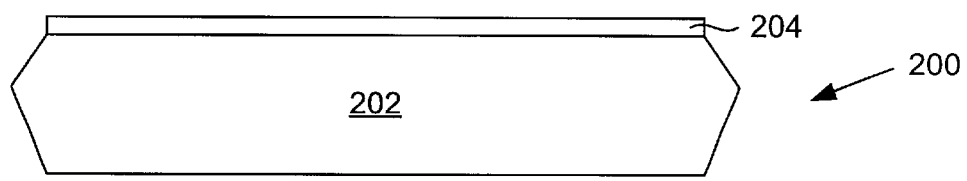
FIGS. 2A–2F are cross-sectional views of steps in the fabrication of a self-aligned contact in a salicided MOS device in accordance with preferred embodiments of the present invention.
Figure 2B:
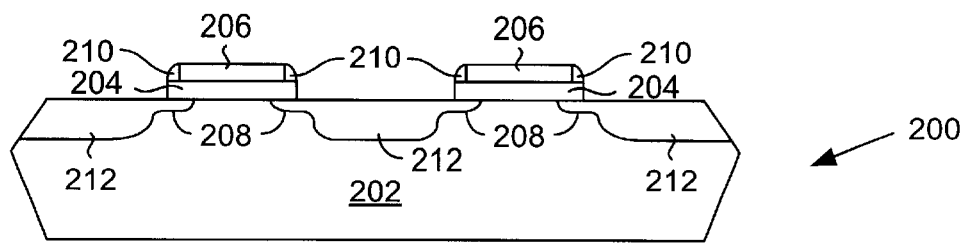

FIGS. 2A through 2F illustrate steps in the fabrication of a semiconductor device having a self-aligned contact in accordance with a preferred embodiment of the present invention. FIG. 2A depicts a semiconductor substrate 202, typically monocrystalline silicon. A gate dielectric 204, typically a thermally grown oxide having a thickness of approximately 50 Å in a 0.25 micron semiconductor device, is formed on the semiconductor substrate 202. FIG. 2B depicts a stage in the fabrication of the semiconductor device 200 after a polysilicon layer has been formed on the gate oxide 204 by procedures well known to those with skill in the art, for example, CVD using a 620° C. deposition followed by a blanket implantation of phosphorus (P) at a power of about 30 KeV, and a dosage of about $5E15/cm^2$.

The polysilicon gate layer, which has a thickness of approximately 2500 Å in a 0.25 micron size semiconductor device is then patterned and etched to form polysilicon gates 206. Following formation of the gates 206, an LDD implant is performed (e.g., arsenic (As), at 15 KeV and $4E14/cm^2$) in order to produce a shallow diffusion region 208 between and beside the gates 206. Next, sidewall spacers 210 are formed, for example according to conventional procedures well known to those with skill in the art, for example by formation of a silicon dioxide or silicon oxynitride layer over the partially formed semiconductor device 200 followed by an anisotropic etch which leaves exposed dielectric material only on vertical surfaces. Accordingly, exposed gate dielectric in addition to dielectric material used to form the sidewall spacers is removed during this etch. Once the sidewall spacers 210 are formed by this etch procedure, a deep $n^+$ implant 212 is formed in the substrate, for example according to procedures well known to those with skill in the art (e.g., As at 80 KeV and $2E15/cm^2$) in order to complete formation of diffusion regions between and beside the polysilicon gates in the semiconductor substrate.

Figure 2C:
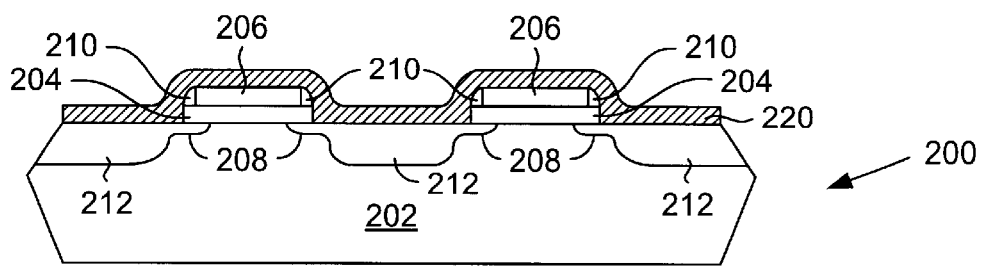

Next, as illustrated in FIG. 2C, a metal capable of silicidation, preferably titanium (Ti) or cobalt (Co) which produce relatively low resistance silicides (e.g., about 2 Ω/[ ] relative to about 8 Ω/[ ] for tungsten silicide), 220 is deposited over the surface of the partially formed semiconductor device 200. This deposition is preferably preceded by a pre-dip step, such as is well known to those with skill in the art, in order to ensure a clean surface for metal deposition. The metal may be deposited alone or as a sandwich with a nitride. One particularly preferred embodiment has a Ti/TiN sandwich deposited by sputtering, for example, about 350 Å Ti/200 Å TiN (in a 0.25 μm device) using a collimator. Such a Ti/TiN sandwich may be useful in improving the reliability of the resulting silicide by preventing encroachment of silicide into adjacent dielectric. As noted above, metals such as Ti or Co may also be independently deposited by sputtering in a similar manner as is well known to those of skill in the art. The deposition may also be conducted using a CVD process.

Following titanium deposition the titanium is converted to titanium silicide by a thermal treatment, preferably by rapid thermal anneal (RTA) according to conditions well known to those with skill in the art. For example, a preferred RTA process for production of titanium silicide ($TiSi_x$) in accordance with this preferred embodiment involves a first relatively low temperature (approximately 650° C.) treatment in order to partially convert titanium deposited over silicon to titanium silicide. Unreacted titanium, that is titanium deposited on surfaces other than silicon, is then removed, for example by etching with a chemical mixture of $H_2SO_4:H_2O_2$. Following removal of the unreacted titanium, a second higher temperature (approximately 900° C.) treatment is conducted to complete conversion of the titanium overlying silicon to titanium silicide. Of course, it should be noted that other methods of converting metals to suicides are well known to those with skill in the art and these techniques might also be used in a process in accordance with the present invention.

Figure 2D:
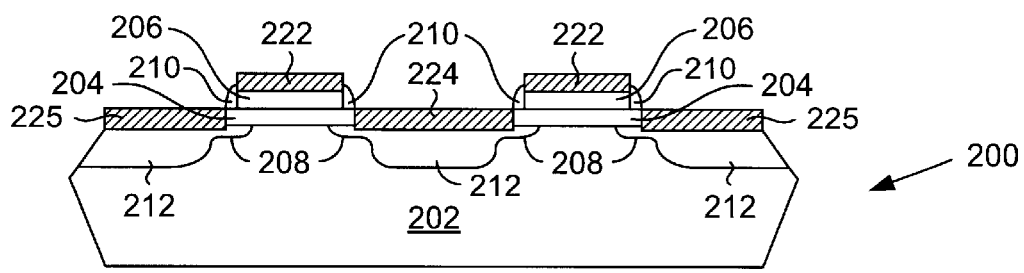

The result of the silicidation process is depicted in FIG. 2D which illustrates that the deposited titanium (or other metal capable of silicidation) 220 has been converted to regions of titanium silicide 222, 224, and 225, over the poly gates 206, and the diffusion regions between, and beside the poly gates, respectively.

Next, a layer of dielectric, for example, silicon oxynitride (SiON) or silicon nitride ($Si_3N_4$), is again deposited over the partially formed semiconductor device 200. This dielectric layer preferably has a thickness of about 400 Å in a 0.25 $\mu$m device, for example. In a preferred embodiment, this deposition is conducted by a CVD process well known to those with skill in the art. This dielectric layer is then patterned and etched in order to form an oversize self-aligned contact etch stop mask 230. This etch step should either show selectivity to both the sidewall spacer dielectric and titanium silicide or should provide enough dielectric thickness margin so that the unwanted SAC etch stop material may be removed without significantly damaging the sidewall spacers 210 and silicide regions 224 and 225.

The SAC etch stop mask 230 is termed "oversize" since it not only covers the silicided poly gates 206, but also overlaps and covers a portion of the poly gate sidewall spacers 210. In a preferred embodiment, the oversize SAC etch stop mask 230 overlaps the sidewall spacers on either side of a poly gate 206 by about 0.1 microns per side, using a 0.25 micron semiconductor device size as an example. In general, this lapping should be sufficient so that the contact interconnect material deposited following self-aligned contact etch processing does not short to the silicided poly gate. In preferred embodiments of the present invention, this overlap is about 20 to 50% of the gate width. The use of this oversize SAC etch stop mask is important to the production of a reliable semiconductor device having a self-aligned contact in accordance with the present invention because it guards against shorting of the contact interconnect material to the gate silicide 222 which could otherwise result if a conventional sized mask (that is a SAC etch stop mask co-extensive with the poly gate 206 and poly gate silicide 222 materials) were used.

Figure 2E:
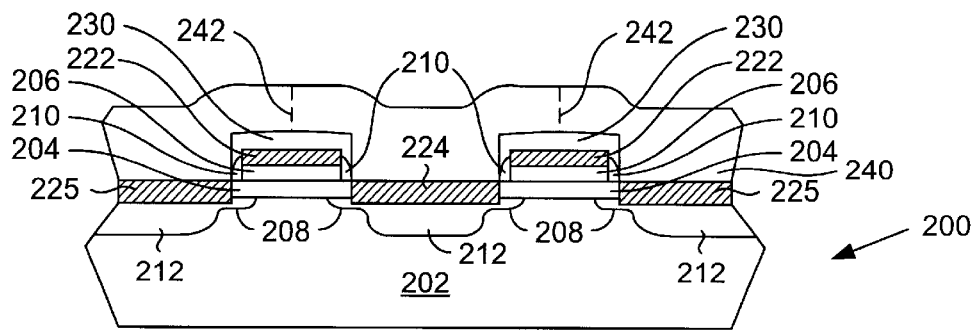

Following formation of the SAC etch stop masks 230, a layer of interlayer dielectric 240, preferably a TEOS oxide is deposited over the partially formed semiconductor device 200 according to procedures well known in the art, for example. This interlayer dielectric layer preferably has a thickness of about 3000 Å in a 0.25 $\mu$m device, for example. Then, a SAC mask (not shown) is applied and the oxide layer 240 is patterned and etched with a chemistry selective for silicide and the material of the SAC etch stop mask 230 (preferably SiON or $Si_3N_4$). The edges of the SAC mask are represented in FIG. 2E by broken lines 242.

Figure 2F:
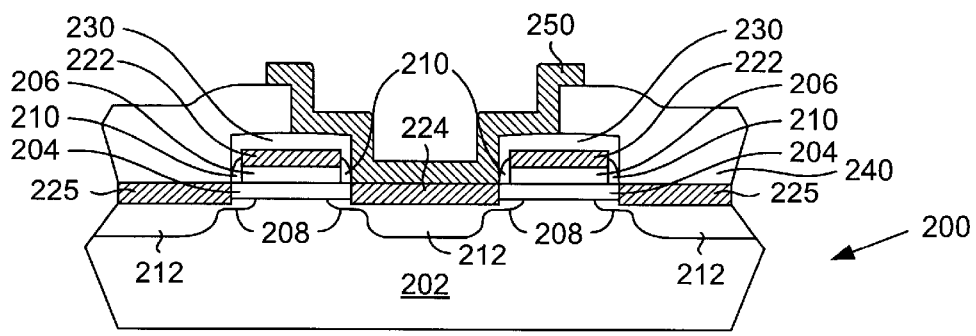
Figure 2E:
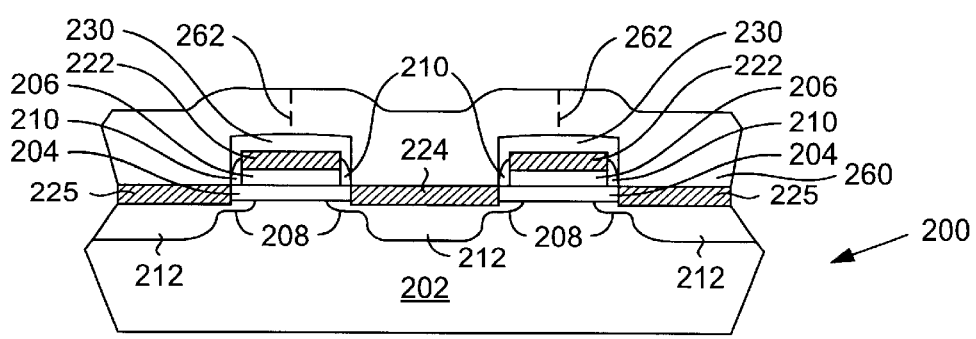
Figure 2F:
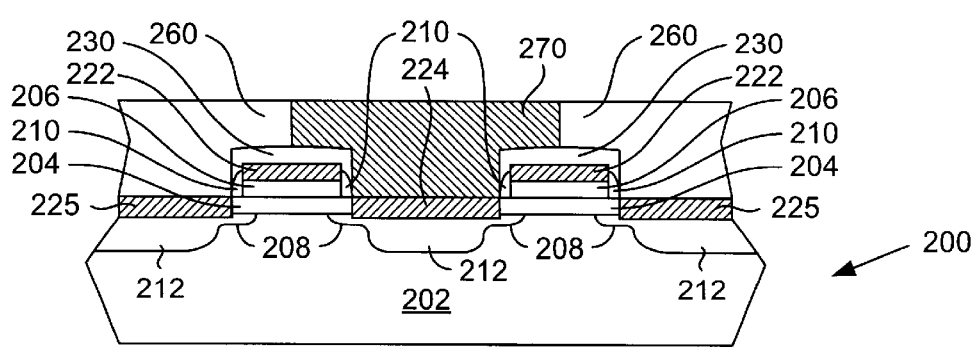

FIG. 2F shows the semiconductor device 200 with the self-aligned contact completed. Following the SAC etch, a conductor 250 such as a layer of polysilicon (poly 2) or metal (such as aluminum (Al), aluminum copper (AlCu), or tungsten (W)) is deposited over the partially formed semiconductor device 200 and patterned and etched according to procedures well known in the art to provide the desired final form.

While several aspects of the present invention are described herein with reference to a 0.25 micron device size, it should be noted that the techniques and principles of the present invention are applicable to any device size regime. The technique of the present invention is particularly advantageous as device sizes move to 0.25 microns and below since, as noted above, at these device sizes conventional techniques lead to reliability problems and/or have sheet resistances greater than those achievable by use of the present invention.

The technique of the present invention, incorporating an oversize SAC etch stop mask in conjunction with a titanium salicide technique may be implemented in a variety of different ways. FIGS. 2E' and 2F' illustrate one alternative embodiment of the present invention in which the self-aligned contact is formed by a tungsten plug. FIG. 2E' depicts the partially formed semiconductor device 200 when, following the steps illustrated in FIGS. 2A through 2D a relatively thick dielectric layer 260, preferably a TEOS oxide having a thickness of about 14,000 Å in a 0.25 $\mu$m device, for example.

This dielectric layer 260 is then planarized, preferably by a chemical mechanical polishing (CMP) technique such as are those well known to those with skill in the art, resulting in a preferable thickness of about 6000 Å above poly. Following planarization of the dielectric layer 260, a SAC etch mask (not shown) is applied and the oxide layer 260 is patterned and etched to form a contact hole. Then, a layer of tungsten with a typical thickness of about 5000 Å (including a glue layer of Ti/TiN, preferably about 300–600 Å) is deposited over the partially formed semiconductor device 200, filling the contact hole. This tungsten layer is then planarized, again preferably by CMP, until the top surface of the interlayer oxide layer 260 is reached. The resulting semiconductor device 200 illustrated in FIG. 2F' has a self-aligned contact composed of a tungsten plug 270.

Figure 3:
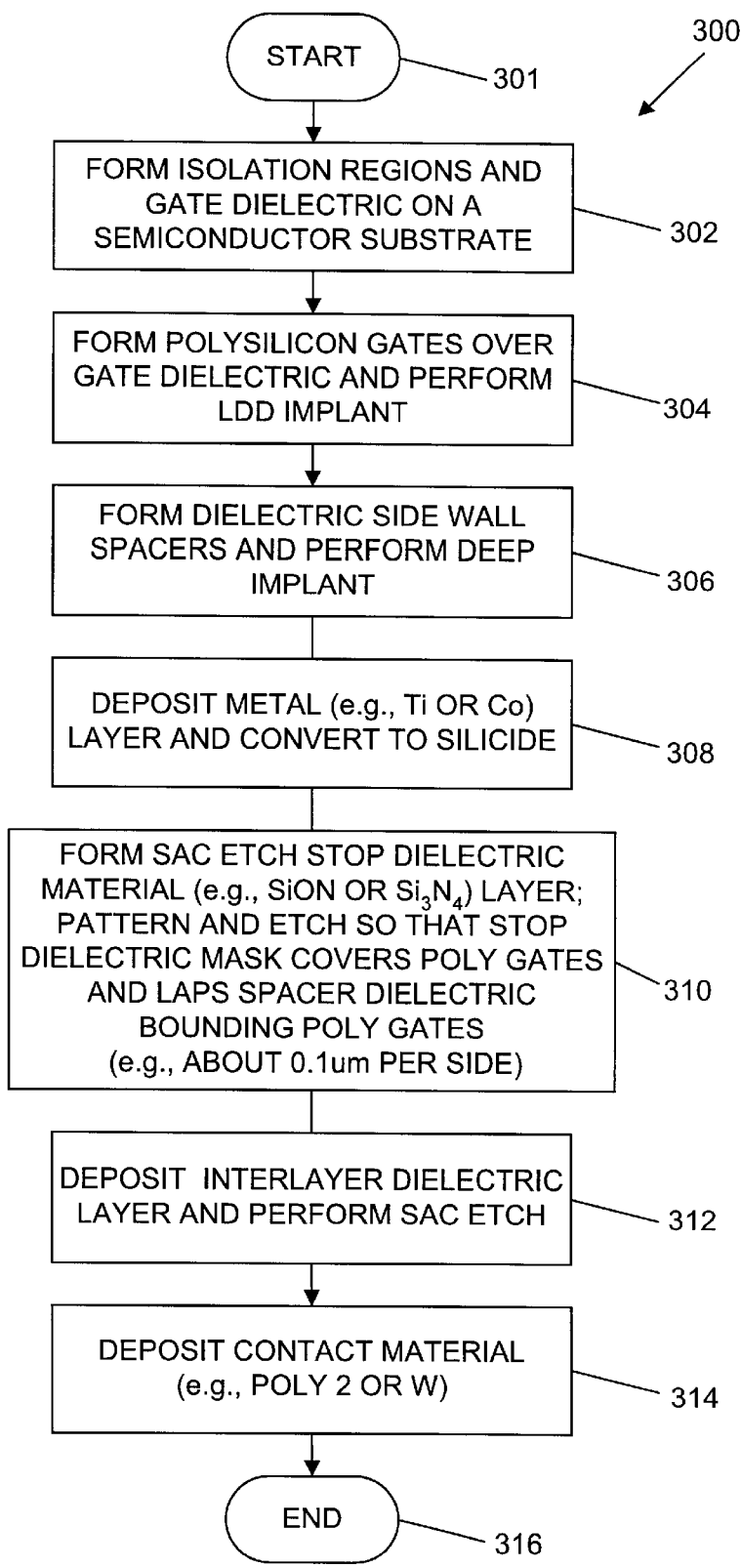
FIG. 3 is a process flow diagram showing steps in the fabrication of a self-aligned contact in a salicided MOS device accordance with the preferred embodiment of the present invention.

FIG. 3 illustrates a generalized process flow diagram for a method of forming a self-aligned contact in accordance with a preferred embodiment of the present invention. The process 300 begins at 301, and at a step 304 and 306 a polysilicon gate having sidewall spacers is formed on a semiconductor substrate having diffusion regions, and separated from the substrate by a gate oxide. As noted above, isolation regions may also be formed on the semiconductor substrate, and the diffusion regions may be formed by a combination LDD and deep $n^+$ implants performed during the gate and sidewall spacer formation. At a step 308, a metal silicide is formed on the polysilicon gate and the diffusion regions. As noted above, this silicide is preferably formed by thermally treating a deposited metal layer, for example titanium or cobalt layer, to convert it to a silicide having a lower resistance than that of tungsten silicide.

Then, at a step 310, a self-aligned contact etch stop mask, composed for example of silicon oxynitride or silicon nitride, is formed over the silicided polysilicon gate and at least a portion of the sidewall spacers. The overlap of the sidewall spacers by the self-aligned contact etch stop mask is preferably about 20–50% of the semiconductor device size, for example, about 0.1 microns in a 0.25 micron size semiconductor device.

At a step 312, an interlayer dielectric layer is formed over the masked gate and silicided diffusion regions, and at a step 312 a self-aligned contact etch of the interlayer dielectric is conducted in order to create a properly positioned contact hole. Then at a step 314, a conductive contact interconnect material is deposited in the contact hole created by the self-aligned contact etch so that an electrical contact is created between the silicided diffusion region between the poly gates and a subsequently deposited conductive layer. As noted above, the contact interconnect material may be composed of, for example, polysilicon (poly 2), aluminum, tungsten or other suitable metal material. The process ends at 316.

The self-aligned contact process and structure of the present invention improves reliability and decreases resistance in MOS devices relative to conventional tungsten silicide processing, and is particularly useful in smaller device sizes (e.g., 0.25 $\mu$m and below) where gate oxides are scaled down below 50 Å in thickness. The invention may find application in Flash memory cells which at small device sizes operate at low voltages using very thin gate oxide, thereby making the use of tungsten silicide questionable. The invention may also find use in large scale memory such as SRAM and DRAM cells in place of conventional self-aligned contact processing and structures. With the integration of logic and memory cells, the invention may also find application in embedded memory semiconductor devices.

Although the foregoing invention has been described in some detail for purposes of clarity of understanding, it will be apparent that certain changes and modifications may be practiced within the scope of the appended claims. It should be noted that there are many alternative ways of implementing both the process and apparatuses of the present invention. Accordingly, the present embodiments are to be considered as illustrative and not restrictive, and the invention is not to be limited to the details given herein, but may be modified within the scope and equivalents of the appended claims.

What is claimed is:

1. A method of making a self-aligned contact in a MOS device, comprising:

forming a polysilicon gate having sidewall spacers on a semiconductor substrate having diffusion regions, said polysilicon gate separated from said substrate by a gate oxide;

forming a metal silicide on said polysilicon gate and said diffusion regions;

forming a self-aligned contact etch stop mask over said silicided polysilicon gate and at least a portion of said sidewall spacers, wherein said mask has at least one opening for at least one contact hole over at least a portion of the diffusion regions;

forming an interlayer dielectric layer over said masked gate and silicided diffusion regions;

conducting a self-aligned contact etch of said interlayer dielectric; and depositing a contact interconnect material in a contact hole created by said self-aligned contact etch.

2. The method of claim 1, wherein said metal silicide comprises at least one of titanium silicide and cobalt silicide.

3. The method of claim 1, wherein said self-aligned contact etch stop mask comprises at least one of silicon oxynitride and silicon nitride.

4. The method of claim 1, wherein said contact interconnect material comprises at least one of polysilicon, aluminum, aluminum copper, and tungsten.

5. The method of claim 1, further comprising forming a second polysilicon gate having sidewall spacers on said substrate, wherein the contact is formed between the first and second polysilicon gates.

6. The method of claim 1, further comprising planarizing said interlayer dielectric layer prior to conducting said self aligned contact etch.

7. The method of claim 6, wherein said planarizing is conducted by chemical mechanical polishing.

8. The method of claim 6, further comprising forming a tungsten plug in the contact hole formed by said self-aligned contact etch.

9. The method of claim 1, wherein said semiconductor device has a device size of about 0.25 microns.

10. The method of claim 1, wherein said semiconductor device has a device size of less than about 0.25 microns.

11. The method of claim 1, wherein said self-aligned contact etch stop mask overlaps said sidewall spacers by about 20 to 50% of said device's gate width.

12. The method of claim 9, wherein said self-aligned contact etch stop mask overlaps said sidewall spacers by about 0.1 microns.

13. A method of making a self-aligned contact in a MOS device, comprising:

forming isolation regions and a gate dielectric layer on a semiconductor substrate;

forming a polysilicon layer on said gate layer;

patterning and etching said polysilicon and gate oxide layers to form polysilicon gates;

forming sidewall spacers on the gates;

forming diffusion regions in the substrate between and beside the gates;

depositing a layer of a metal over said polysilicon gates and said diffusion regions;

converting said metal to a metal silicide;

removing unreacted metal;

forming a self-aligned contact etch stop mask over said silicided polysilicon gates and at least a portion of said sidewall spacers, wherein said mask has at least one opening for at least one contact hole over at least a portion of the diffusion region;

forming an interlayer dielectric layer over said masked gate and silicide diffusion regions;

conducting a self-aligned contact etch of said interlayer dielectric using chemistry selective for silicon and the self-aligned contact etch stop mask material; and depositing a contact interconnect material in a contact hole created by said self-aligned contact etch.

14. The method of claim 13, wherein said metal is converted to silicide by heating at a temperature of no more than about 1000° C.

15. The method of claim 13, wherein said metal is at least one of titanium, cobalt, and titanium/titanium nitride.

* * * * *